(12) United States Patent
Lee et al.

(10) Patent No.: US 9,043,740 B2
(45) Date of Patent: May 26, 2015

(54) FABRICATION OF A MAGNETIC TUNNEL JUNCTION DEVICE

(71) Applicant: QUALCOMM Incorporated, San Diego, CA (US)

(72) Inventors: Kangho Lee, San Diego, CA (US); Xiaochun Zhu, San Diego, CA (US); Xia Li, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/048,918

(22) Filed: Oct. 8, 2013

(65) Prior Publication Data

US 2014/0038312 A1 Feb. 6, 2014

Related U.S. Application Data

(62) Division of application No. 13/349,633, filed on Jan. 13, 2012, now Pat. No. 8,580,583, which is a division of application No. 12/396,359, filed on Mar. 2, 2009, now Pat. No. 8,120,126.

(51) Int. Cl.
| | |
|---|---|
| *G06F 17/50* | (2006.01) |
| *H01L 43/02* | (2006.01) |
| *B82Y 25/00* | (2011.01) |
| *B82Y 40/00* | (2011.01) |

(Continued)

(52) U.S. Cl.
CPC ............... *H01L 43/02* (2013.01); *B82Y 25/00* (2013.01); *B82Y 40/00* (2013.01); *G06F 17/5068* (2013.01); *H01F 10/3254* (2013.01); *H01F 41/309* (2013.01); *H01F 41/32* (2013.01); *H01L 27/228* (2013.01); *H01L 43/08* (2013.01); *H01L 43/12* (2013.01); *H01F 10/329* (2013.01)

(58) Field of Classification Search
USPC .............. 438/3; 257/213, 288, 295, 296, 421; 716/110, 118–119; 365/65–66, 158, 365/171, 173
See application file for complete search history.

(56) References Cited

U.S. PATENT DOCUMENTS

| | | |
|---|---|---|
| 7,009,877 B1 | 3/2006 | Huai et al. |
| 7,088,609 B2 | 8/2006 | Valet |

(Continued)

FOREIGN PATENT DOCUMENTS

| | | |
|---|---|---|
| CN | 101162756 A | 4/2008 |
| JP | 2005268251 A | 9/2005 |

(Continued)

OTHER PUBLICATIONS

Taiwan Search Report—TW099106060—TIPO—Apr. 8, 2014.

(Continued)

*Primary Examiner* — Stacy Whitmore
(74) *Attorney, Agent, or Firm* — Donald D. Min (57) ABSTRACT

A magnetic tunneling junction device and fabrication method is disclosed. In a particular embodiment, a non-transitory computer-readable medium includes processor executable instructions. The instructions, when executed by a processor, cause the processor to initiate deposition of a capping material on a free layer of a magnetic tunneling junction structure to form a capping layer. The instructions, when executed by the processor, cause the processor to initiate oxidization of a first layer of the capping material to form a first oxidized layer of oxidized material.

18 Claims, 5 Drawing Sheets

(51) Int. Cl.
*H01F 10/32* (2006.01)
*H01F 41/30* (2006.01)
*H01F 41/32* (2006.01)
*H01L 43/08* (2006.01)
*H01L 43/12* (2006.01)
*H01L 27/22* (2006.01)

(56) References Cited

U.S. PATENT DOCUMENTS

| | | | |
|---|---|---|---|
| 7,141,438 B2 | 11/2006 | Ha et al. | |
| 7,300,711 B2 | 11/2007 | Parkin et al. | |
| 7,430,135 B2 | 9/2008 | Huai et al. | |
| 7,479,394 B2 * | 1/2009 | Horng et al. | 438/3 |
| 7,596,015 B2 | 9/2009 | Kitagawa et al. | |
| 7,606,063 B2 * | 10/2009 | Shen et al. | 365/158 |
| 7,819,979 B1 * | 10/2010 | Chen et al. | 134/1.1 |
| 8,058,696 B2 * | 11/2011 | Ranjan et al. | 257/421 |
| 8,080,432 B2 * | 12/2011 | Horng et al. | 438/3 |
| 8,120,126 B2 * | 2/2012 | Lee et al. | 257/421 |
| 8,143,683 B2 * | 3/2012 | Wang et al. | 257/421 |
| 8,238,681 B2 * | 8/2012 | Samurov et al. | 382/255 |
| 8,436,437 B2 * | 5/2013 | Horng et al. | 257/421 |
| 8,580,583 B2 * | 11/2013 | Lee et al. | 438/3 |
| 2005/0002229 A1 * | 1/2005 | Matsutera et al. | 365/171 |
| 2005/0035386 A1 | 2/2005 | Ha et al. | |
| 2007/0014149 A1 | 1/2007 | Nagamine et al. | |
| 2007/0015294 A1 * | 1/2007 | Horng et al. | 438/3 |
| 2007/0047153 A1 * | 3/2007 | Zeltser | 360/324 |
| 2007/0076471 A1 | 4/2007 | Kano et al. | |
| 2007/0148786 A1 * | 6/2007 | Horng et al. | 438/2 |
| 2007/0195594 A1 | 8/2007 | Koga | |
| 2007/0201265 A1 | 8/2007 | Ranjan et al. | |
| 2007/0243638 A1 * | 10/2007 | Horng et al. | 438/3 |
| 2007/0297218 A1 * | 12/2007 | Abraham et al. | 365/158 |
| 2008/0088980 A1 | 4/2008 | Kitagawa et al. | |
| 2008/0133551 A1 * | 6/2008 | Wensley et al. | 707/100 |
| 2008/0138660 A1 * | 6/2008 | Parkin | 428/812 |
| 2008/0164547 A1 | 7/2008 | Higo et al. | |
| 2008/0179699 A1 | 7/2008 | Horng et al. | |
| 2008/0186758 A1 * | 8/2008 | Shen et al. | 365/158 |
| 2008/0253039 A1 | 10/2008 | Nagamine et al. | |
| 2008/0259673 A1 * | 10/2008 | Wise | 365/158 |
| 2009/0261433 A1 * | 10/2009 | Kang et al. | 257/421 |
| 2010/0207219 A1 * | 8/2010 | Jin et al. | 257/421 |
| 2010/0258878 A1 | 10/2010 | Mise et al. | |
| 2010/0320076 A1 | 12/2010 | Zhao et al. | |
| 2011/0117677 A1 * | 5/2011 | Yuan et al. | 438/3 |
| 2012/0107966 A1 | 5/2012 | Lee et al. | |

FOREIGN PATENT DOCUMENTS

| | | |
|---|---|---|
| JP | 2007142424 A | 6/2007 |
| JP | 2007157840 A | 6/2007 |
| JP | 2008010745 A | 1/2008 |
| JP | 2008098523 A | 4/2008 |
| JP | 2008263031 A | 10/2008 |
| KR | 20050017042 A | 2/2005 |
| KR | 100490652 B1 | 5/2005 |
| KR | 20060049265 A | 5/2006 |
| KR | 20080033846 A | 4/2008 |

OTHER PUBLICATIONS

Chih-Ta Shen, et al., "Improvement of Transport Properties in Magnetic Tunneling Junctions by Capping Materials," IEEE Transactions of Magnetics, IEEE Service Center, New York, NY, vol. 43, No. 6, Jun. 1, 2007, pp. 2785-2787.

Diao, Zhitao, et al., "Spin Transfer Switching in Dual MgO Magnetic Tunnel Junctions," Applied Physics Letters 90, 132508 (2007).

Huai, Yiming, et al., "Spin Transfer Switching Current Reduction in Magnetic Tunnel Junction Based Dual Spin Filter Structures," Applied Physics Letters 87, 222510 (2005).

International Search Report—PCT/US2010/025837—International Search Authority—European Patent Office, May 26, 2010.

Slonczewsik, J.C., "Current-Driven Excitation of Magnetic Muitilayers," Letter to the Editor, Journal of Magnetism and Magnetic Materials 159 (1996) L1-L7, IBM Research Division.

Written Opinion—PCT/US2010/025837—International Search Authority—European Patent Office, May 25, 2010.

* cited by examiner

FABRICATION OF A MAGNETIC TUNNEL JUNCTION DEVICE

I. CLAIM OF PRIORITY

The present application claims priority from and is a divisional application of U.S. patent application Ser. No. 13/349,633, filed Jan. 13, 2012, which claims priority from and is a divisional application of U.S. patent application Ser. No. 12/396,359, filed Mar. 2, 2009, (now U.S. Pat. No. 8,120,126), the content of each of which is incorporated by reference herein in its entirety.

II. FIELD

The present disclosure is generally related to magnetic tunneling junction (MTJ) devices and fabrication, and particularly to a MTJ structure that incorporates a capping layer.

III. DESCRIPTION OF RELATED ART

MTJ elements may be used to create a magnetic random access memory (MRAM). An MTJ element typically includes a pinned layer, a magnetic tunnel barrier, and a free layer, where a bit value is represented by a magnetic moment in the free layer. A bit value stored by an MTJ element is determined by a direction of the magnetic moment of the free layer relative to a direction of a fixed magnetic moment carried by the pinned layer. The magnetization of the pinned layer is fixed while the magnetization of the free layer may be switched.

When a current flows through the MTJ element, the magnetization direction of the free layer may be changed when the current exceeds a threshold value, i.e. critical switching current ($I_c$). According to a spin-torque-transfer model of J. Sloneczewski, $I_c$ is proportional to effective damping constant ($\alpha$), saturation magnetization ($M_s$), and thickness ($t_{free}$) of the free layer, i.e. $I_c \sim \alpha M_s t_{free}$. Lowering the critical switching current enables low power consumption and smaller chip area of STT-MRAM technologies, which may be achieved by reducing $\alpha$, $M_s$, and $t_{free}$. In particular, decreasing $\alpha$ may not degrade thermal stability ($E_B$) of a MTJ, whereas $E_B$ is likely to be degenerated with decreasing $M_s$ and $t_{free}$ since $E_B \sim M_s t_{free}$. Generally, the effective damping constant of a thin ferromagnetic metal film such as the free layer may largely be affected by the thickness of the film and of the composition of the surrounding layers. In particular, non-magnetic metals adjacent to the free layer can significantly increase the effective damping constant via a spin pumping effect. A conventional MTJ film structure may include a capping layer on top of the free layer to protect the MTJ film from subsequent fabrication process steps following MTJ film deposition. Non-magnetic metals (e.g. Ta or TaN) that are compatible with Si CMOS processes have been used as a capping layer.

The effective damping constant of the free layer is typically larger than the intrinsic damping constant of the bulk material corresponding to the free layer since it includes a damping component representing a loss of angular momentum from the magnetization of the free layer due to exchange coupling with free electrons able to leave the free layer. This "spin pumping" effect results in a greater amount of current needed to change a direction of the magnetic moment of the free layer. Suppression of the spin pumping effect may reduce the critical switching current density of the MTJ device.

In order to suppress the spin pumping effect from the capping layer and reduce $\alpha$, various materials and schemes for the capping layer have been investigated. As an example, a "dual MgO" MTJ structure has been suggested. The dual MgO MTJ structure exhibited a low critical switching current (~0.52 MA/cm$^2$) by incorporating RF-sputtered MgO on top of the free layer, which was attributed to the reduced spin pumping effect. However, the additional MgO layer increased the resistance-area product (RA) and degraded the magnetoresistance (MR), which is generally not desirable for securing operating margins for STT-MRAM bitcells. Hence, a more practical methodology for suppressing the spin pumping effect without sacrificing RA and MR would be beneficial to help ensure adequate write and read performance of STT-MRAM devices.

IV. SUMMARY

A capping layer adjacent to a free layer of a MTJ device may be formed of a metal layer and layer of a metal oxide. The capping layer including the metal oxide may reduce a switching current density, while the metal layer may prevent diffusion of oxygen from the oxide layer during a magnetic annealing step and, thereby MR reduction. In addition, a high-quality metal/metal-oxide capping layer may not increase RA by enabling coherent tunneling of spin-polarized electrons through the double barrier.

In a particular embodiment, an apparatus is disclosed that includes a MTJ device. The MTJ device includes a barrier layer, a free layer, and a capping layer. The free layer is positioned between the barrier layer and the capping layer. The capping layer includes a first metal portion and an oxidized metal portion.

In another particular embodiment, an apparatus is disclosed that includes a MTJ device. The MTJ device includes a free layer, a barrier layer adjacent the free layer, and a capping layer adjacent to the free layer. The capping layer includes a first layer of a first material, a second layer of a second material, and a buffer layer. The second material includes an oxide of the first material.

In another particular embodiment, an apparatus is disclosed that includes means for storing a data value as an orientation of a magnetic moment that is programmable by a spin polarized current exceeding a critical switching current density. The apparatus also includes tunneling barrier means that are thin enough to provide sufficient conduction electrons to the means for storing by quantum mechanical tunneling of conduction electrons through the barrier. The apparatus further includes capping means for reducing a spin pumping effect. The capping means includes a first metal portion and an oxidized metal portion. The means for storing is positioned between the tunneling barrier means and the capping means.

In another particular embodiment, a method is disclosed that includes depositing a capping material on a free layer of a MTJ structure to form a capping layer. The method also includes oxidizing a portion of the capping material to form a layer of oxidized material.

In another embodiment, the method includes forming a barrier layer, forming a free layer, and forming a capping layer. The barrier layer is adjacent to the free layer and the capping layer is adjacent to the free layer. The capping layer includes a first layer of a substantially non-magnetic material and a second layer of an oxide of the substantially non-magnetic material.

One particular advantage provided by at least one of the disclosed embodiments is to reduce a switching current density by reducing an effective damping constant as compared to MTJ devices that do not include an oxide capping layer, while simultaneously increasing the magnetoresistance (MR)

and reducing the resistance-area (RA) product of the MTJ as compared to MTJ devices that use an oxide-only capping layer. Other aspects, advantages, and features of the present disclosure will become apparent after review of the entire application, including the following sections: Brief Description of the Drawings, Detailed Description, and the Claims.

VI. DETAILED DESCRIPTION

Figure 1:
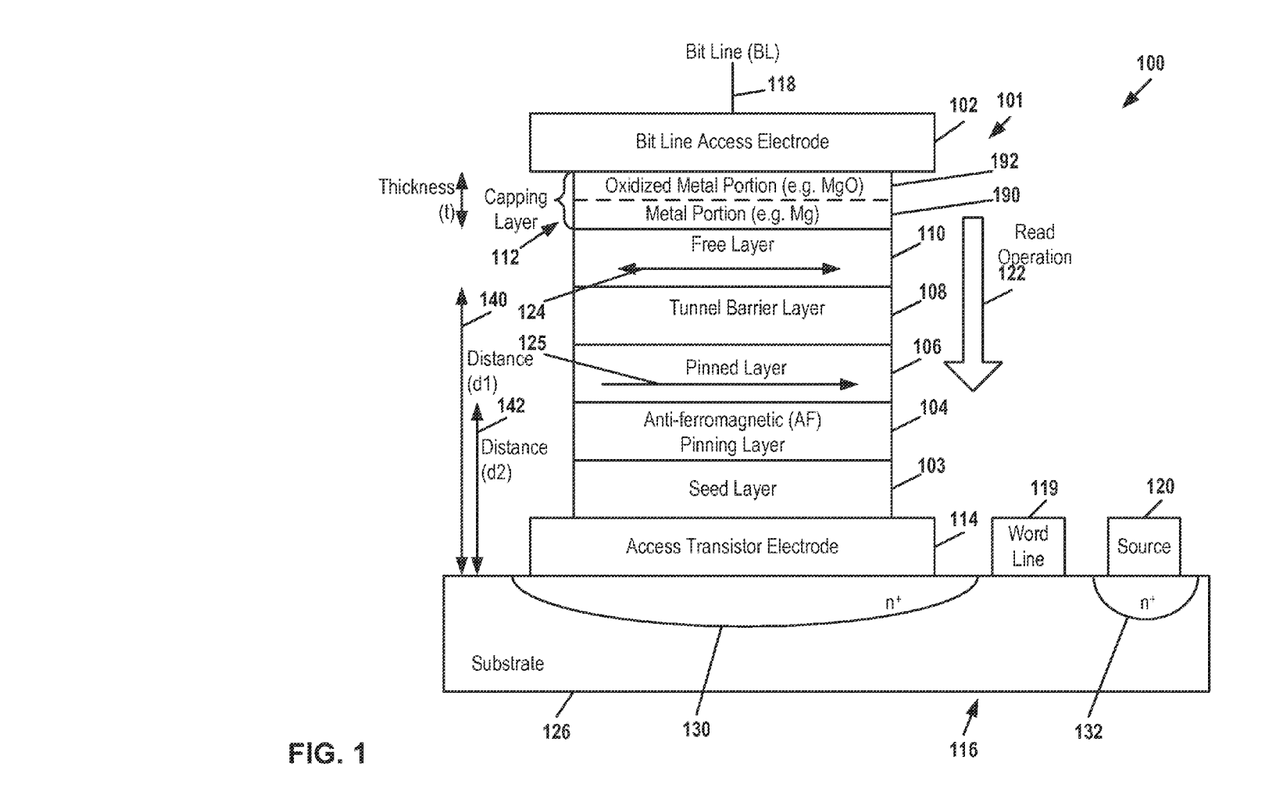
FIG. 1 is an illustrative embodiment of an element of a spin-torque-transfer magnetic random access memory (STT-MRAM) including a magnetic tunneling junction (MTJ) device with a metal/metal-oxide capping layer.

Referring to FIG. 1, a first illustrative embodiment of an element of a spin-torque-transfer magnetic random access memory (STT-MRAM) is depicted and generally designated 100. The element of the STT-MRAM 100 includes a memory cell having a magnetic tunneling junction (MTJ) device 101 and an access transistor 116 on a substrate 126. The MTJ device 101 includes an access transistor electrode 114, a seed layer 103, an anti-ferromagnetic (AFM) pinning layer 104, a pinned layer 106, a tunnel barrier layer 108, a free layer 110, a capping layer 112, and a bit line access electrode 102 coupled to a bit line 118. The access transistor electrode 114 is coupled to a drain region 130 of the access transistor 116. The access transistor 116 is gated by a word line 119 and has a source region 132 coupled to a source contact 120.

The seed layer 103 is in contact with the access transistor electrode 114. The seed layer 103 provides a surface for MTJ film deposition and can be composed of several different layers. The AFM pinning layer 104 is in contact with the seed layer 103. The AFM pinning layer 104 causes an orientation of a magnetic moment 125 of the pinned layer 106 to be pinned in a particular direction. The pinned layer 106 is in contact with the AFM pinning layer 104 and may be composed of a ferromagnetic material.

The tunnel barrier layer 108 is in contact with the pinned layer 106 and physically isolates the pinned layer 106 from the free layer 110 while enabling current flow via electron tunneling across the tunnel barrier layer 108. The tunnel barrier layer 108 may be composed of a non-magnetic material. In an illustrative embodiment, the tunnel barrier layer 108 includes magnesium oxide (MgO).

The free layer 110 is in contact with the tunnel barrier layer 108 and is located at a distance d1 140 from the substrate 126. The free layer 110 has a magnetic moment 124 that may be in a parallel or antiparallel alignment with the magnetic moment 125 of the pinned layer 106. The pinned layer 106 may be at a distance d2 142 from the substrate 126 where the distance d2 142 is less than the distance d1 140. The magnetic moment 124 of the free layer 110 may be written by a current exceeding a critical switching current and may be read using a current that is less than the critical switching current. For example, the read current may be much less than the critical switching current to prevent read disturbances. In an illustrative embodiment, the free layer 110 may be a single ferromagnetic layer. In another illustrative embodiment, the free layer 110 may be a synthetic ferromagnetic layer.

The capping layer 112 is in contact with the free layer 110. The capping layer 112 is configured to reduce the effective damping constant of the free layer 110 by reducing the spin pumping effect, and thus reduces the critical switching current without introducing a substantial series resistance through the MTJ device 101. The capping layer 112 includes a metal portion 190 and an oxidized metal portion 192. For example, the metal portion 190 may be predominantly magnesium (Mg) (e.g. Mg with impurities, accidental or intentional) and the oxidized metal portion 192 may be predominantly magnesium oxide (MgO) (e.g. MgO with impurities, accidental or intentional). The tunnel barrier layer 108 may also include magnesium (Mg) and magnesium oxide (MgO), enabling the use of the same material for multiple layers and reducing the number of materials used during fabrication of the element of the STT-MRAM 100.

In an illustrative embodiment, the capping layer 112 includes a graded $Mg_xMgO_{1-x}$ layer that is formed by depositing magnesium to form a metal layer having a total thickness (t) and then performing an oxidation process to form the oxidized metal portion 192. The oxidation process may be set to control a thickness and variation of the resulting MgO layer more reliably than by other deposition techniques. For example, the total thickness of the capping layer 112 may be less than one nanometer and the thickness of the oxidized metal portion 192 may be, for example, five angstroms (0.5 nm), four angstroms, three angstroms, or any other thickness.

In a particular embodiment, the material of the oxidized metal portion 192 may have physical properties that reduce the spin pumping effect and, thereby reduce the effective damping constant of the free layer 110. However, the material of the oxidized metal portion 192 can introduce a high resistance to the MTJ device 101 due to a series resistance added by the additional oxide insulator. By forming a metal-oxide layer via partial oxidation of the metal portion 190, the resistance of the MTJ device 101 may not be significantly increased via coherent tunneling of spin-polarized electrons across double MgO barriers, while beneficial effects of the reduced effective damping constant of the free layer 110 due to the oxidized metal portion 192 may also be obtained. For example, the capping layer 112 may increase the series resistance of the MTJ device 101 by two hundred ohms or less, while reducing the critical switching current density by thirty percent or more. Smaller critical switching current density can enable smaller devices, higher density memory arrays, lower power operation, higher clocking frequency, or any combination thereof.

The metal portion 190 may be formed of a wide variety of materials. For example, in a particular embodiment the metal portion 190 includes Hafnium (Hf), Zirconium (Zr), Mg, or any combination thereof. For example, elements with a low electronegativity, such as Hf, Zr, and Mg, may be able to getter oxygens in the free layer 110 during a magnetic annealing and enhance MR. To illustrate, Mg has a lower electronegativity than Tantalum (Ta), and a MTJ with a Mg capping layer can exhibit higher MR than a similar MTJ with a Ta capping layer. Hence, a low electronegativity element such as Mg in the metal portion 190 of the capping layer 112 may assist in maintaining or even enhancing MR. However, in other embodiments, the capping layer may not include Hf, Zr, Mg, or any combination of Hf, Zr, or Mg, and may instead include other materials.

The direction in which a write current is passed through the MTJ device 101 determines whether the magnetic moment 124 of the free layer 110 is aligned to be parallel or anti-parallel to the magnetic moment 125 of the pinned layer 106. In an illustrative embodiment, a data "1" value may be stored by passing a first write current from the bit line access electrode 102 to the access transistor electrode 114 to align the magnetic moment 124 anti-parallel to the magnetic moment 125. A data "0" value may be stored by passing a second write current from the access transistor electrode 114 to the bit line access electrode 102 to align the magnetic moment 124 parallel to the magnetic moment 125.

When a read operation 122, is performed at the STT-MRAM 100, a read current may flow from the bit line access electrode 102 to the source 120 or the read current may flow from the source 120 to the bit line access electrode 102. In a particular embodiment, a direction of the read current may be determined based on which direction provides the largest read signal. In a particular embodiment, when the read operation 122 is performed on the element of the STT-MRAM 100, a read current flows through via the bit line (BL) 118, in a direction from the bitline access electrode 102 to the access transistor electrode 114. The read current through the MTJ device 101 encounters a resistance corresponding to a relative orientation of the magnetic moment 125 and the magnetic moment 124. When the magnetic moment 125 of the pinned layer 106 has a parallel orientation to the magnetic moment 124 of the free layer 110, the read current encounters a resistance different than when the magnetic moment 125 of the pinned layer 106 has an anti-parallel orientation to the magnetic moment 124 of the free layer 110.

The bitcell may therefore be used as an element of a memory device, such as an STT-MRAM. By employing the capping layer 112, the effective damping constant of the free layer 110 may be substantially reduced, decreasing a critical switching current density ($J_C$) without increasing a resistance-area (RA) product and degrading a magnetoresistance (MR) as much as using an oxide-only capping material. Lower power operation and less heat generation may result from decreasing $J_C$ without substantially decreasing MR and without substantially increasing RA, and operation using shorter write pulse lengths and higher clock frequency may also be enabled.

Figure 2:
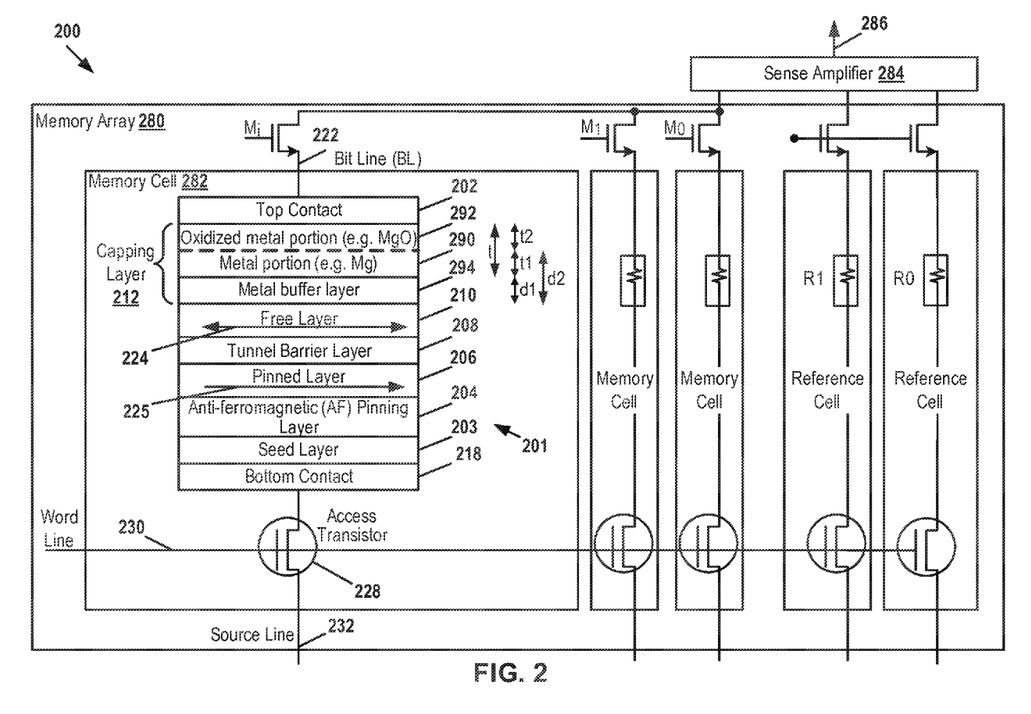
FIG. 2 is an illustrative embodiment of an memory array including a magnetic tunneling junction (MTJ) structure with a thin metal buffer/metal/metal-oxide capping layer.

Referring to FIG. 2, another illustrative embodiment of a memory system is depicted and generally designated 200. The memory system 200 includes a memory array 280, such as a STT-MRAM memory array, that includes multiple memory cells, including a representative memory cell 282, and representative pair of reference cells that store a logical high value and a logical low value. A sense amplifier 284 is coupled to receive an output from a selected memory cells in addition to receiving outputs from the reference cells. The sense amplifier 284 is configured to produce an amplifier output 286 that indicates a value stored at a selected memory cell.

The memory cell 282 includes a MTJ structure 201 coupled to an access transistor 228. The MTJ structure 201 includes a top contact 202, a capping layer 212, a free layer 210 having a magnetic moment 224, a tunnel barrier layer 208, a pinned layer 206 having a pinned magnetic moment 225, an anti-ferromagnetic (AFM) pinning layer 204, a seed layer 203, and a bottom contact 218. An access transistor 228 is coupled to the bottom contact 218 and coupled to a word line 230 and a source line 232.

The top contact 202 provides a first electrical contact to a bit line 222. The AFM pinning layer 204 fixes an orientation of the magnetic moment 225 of the pinned layer 206. The pinned layer 206 may be a synthetic pinned layer including multiple layers (not shown). The tunnel barrier layer 208 may restrict free electron access but enables tunneling current to the free layer 210. The free layer 210 may store a data value as an orientation of the magnetic moment 224 that is programmable by application of a spin polarized current that exceeds a critical switching current. The free layer 210 is positioned between the tunnel barrier layer 208 and the capping layer 212, such that the tunnel barrier layer 208 is adjacent to a first side of the free layer 210 and the capping layer 212 is adjacent to a second side of the free layer 210, where the second side is opposite to the first side.

The capping layer 212 reduces a spin pumping effect to reduce an effective damping constant of the free layer 210. The capping layer 212 includes first layer 290 of a first material and a second layer 292 of a second material. In a particular embodiment, the first material is a metal and the second material is an oxide of the first material. For example, the first layer 290 may be a metal layer and the second layer 292 may be an oxidized metal layer. The capping layer 212 may also include a third layer 294, which may be a thin metal buffer layer. In a particular embodiment, the third layer 294 is a layer of non-magnetic material. The third layer 294 may be selected to provide an appropriate surface for high-quality oxide growth. In an illustrative embodiment, the first material of the first layer 290 is predominantly magnesium (Mg) and the second material of the second layer 292 is predominantly magnesium oxide (MgO).

The first layer 290 may have a thickness t1 and may be positioned a first distance d1 from the free layer 210. The second layer 292 may have a thickness t2 and may be positioned a second distance d2 from the free layer 210. In a particular embodiment, the second distance d2 is greater than the first distance d1. The capping layer 212 may include the third layer 294. In other embodiments, the capping layer 212 may not include the third layer 294 or may include one or more additional layers (not shown).

In a particular embodiment, the first layer 290 and the second layer 292 may be formed by depositing a single layer of a material (e.g. Mg) to a total thickness t and then oxidizing the material to form the second layer 292 above the first layer 290. The second layer 292 may have the thickness t2 and the first layer 290 may have the thickness t1, where a sum of t1 and t2 is approximately equal to the total thickness t. Alternatively, in other embodiments, one or more of the layers of the capping layer 212 may be formed by radio frequency (RF) sputtering or other type of fabrication process.

The capping layer 212 may reduce the effective damping constant of the free layer 210 in a manner substantially similar to the operation of the capping layer 112 of FIG. 1. In addition, the first material may be selected and configured to reduce a series resistance between the free layer 210 and the second layer 292 in comparison to a MTJ structure that does not include the first layer 290. Similarly, the material of the third layer 294 may be selected to provide an appropriate surface for deposition of the first layer 290, to decrease spin-flip scattering, to provide other physical characteristics, or any combination thereof.

The memory array 280 depicted in FIG. 2 may include multiple cells substantially similar to the representative memory cell 282. The memory array 280, or any other array of cells using the MTJ device 101 of FIG. 1 or the MTJ structure 201 of FIG. 2, may be implemented in an embedded memory, such as a level two (L2) cache or other type of embedded memory, as an illustrative example. Such an array of MTJ cells may be implemented as a STT-MRAM memory to replace memory arrays that use static random access memory (SRAM), dynamic random access memory (DRAM) or flash memory technologies, for example.

Figure 3:
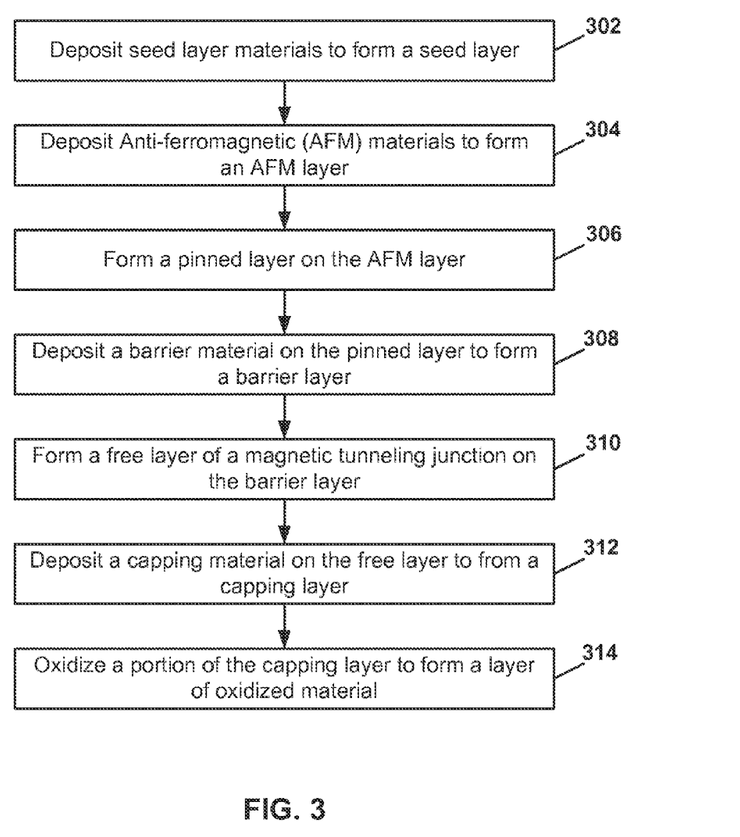
FIG. 3 is a flow diagram of a first illustrative embodiment of a method of forming a magnetic tunneling junction (MTJ) device.

FIG. 3 is a flow diagram of a first illustrative embodiment of a method of forming a magnetic tunneling junction (MTJ) device. In an illustrative embodiment, the MTJ device may be the MTJ device 101 of FIG. 1 or the MTJ structure 201 of FIG. 2. In a particular embodiment, the method includes forming a magnetic tunneling junction by depositing seed layer materials to form a seed layer, at 302, depositing anti-ferromagnetic (AFM) materials on the seed layer to form an AFM layer, at 304, forming a pinned layer on the AFM layer, at 306, depositing a barrier material on the pinned layer to form a barrier layer, at 308, and forming a free layer of the MTJ on the barrier layer, at 310.

Continuing to 312, a capping material is deposited on the free layer of the magnetic tunnel junction structure to form a capping layer. The capping layer may have a thickness that is less than one nanometer. In a particular embodiment, the capping material includes magnesium.

Advancing to 314, a portion of the capping material is oxidized to form a layer of oxidized material (e.g., In a particular embodiment, oxidizing the capping material reduces the critical current density of the MTJ compared to the critical current density that the MTJ would have without the capping layer.

The depositing and the oxidizing may be controlled by a processor integrated into an electronic device, such as a computer configured to control fabrication machinery. By oxidizing the capping material, a thickness of the layer of oxidized material may be more accurately controlled than by other techniques of applying material such as RF sputtering. For example, the layer of oxidized material may be controlled to have a thickness that is less than four angstroms with enhanced uniformity.

Figure 4:
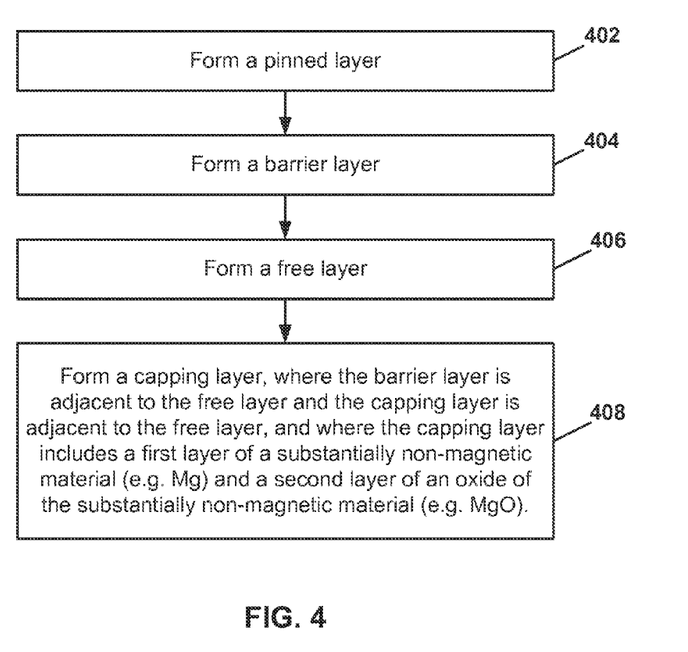
FIG. 4 is a flow diagram of a second illustrative embodiment of a method of forming a magnetic tunneling junction (MTJ) device.

FIG. 4 is a flow diagram of a second illustrative embodiment of a method of forming a magnetic tunneling junction (MTJ) device. In an illustrative embodiment, the MTJ device may be the MTJ device 101 of FIG. 1 or the MTJ structure 201 of FIG. 2. At 402, a pinned layer may be formed. Moving to 404, a barrier layer is formed, and at 406, a free layer is formed.

Continuing to 408, a capping layer is formed, where the barrier layer is adjacent to the free layer and the capping layer is adjacent to the free layer. The capping layer includes a first layer of a substantially non-magnetic material and a second layer of an oxide of the substantially non-magnetic material. In a particular embodiment, the substantially non-magnetic material includes magnesium (Mg) and the oxide includes magnesium oxide (MgO).

For example, the barrier layer may be adjacent to one side of the free layer and the capping layer may be adjacent to a second side of the free layer, where the second side is opposite to the first side. The first layer may be positioned closer to the free layer than the second layer so that a first distance between the first layer and the free layer is less than a second distance between the second layer and the free layer.

In other embodiments, the method of FIG. 4 may be performed in an order that is different than depicted. For example, the capping layer may be formed prior to formation of the free layer. In an alternative embodiment, the MTJ device that is formed may have a reversed structure than depicted in FIG. 1, with the capping layer closer to the substrate than the free layer, and with the free layer closer to the substrate than the capping layer.

Figure 5:
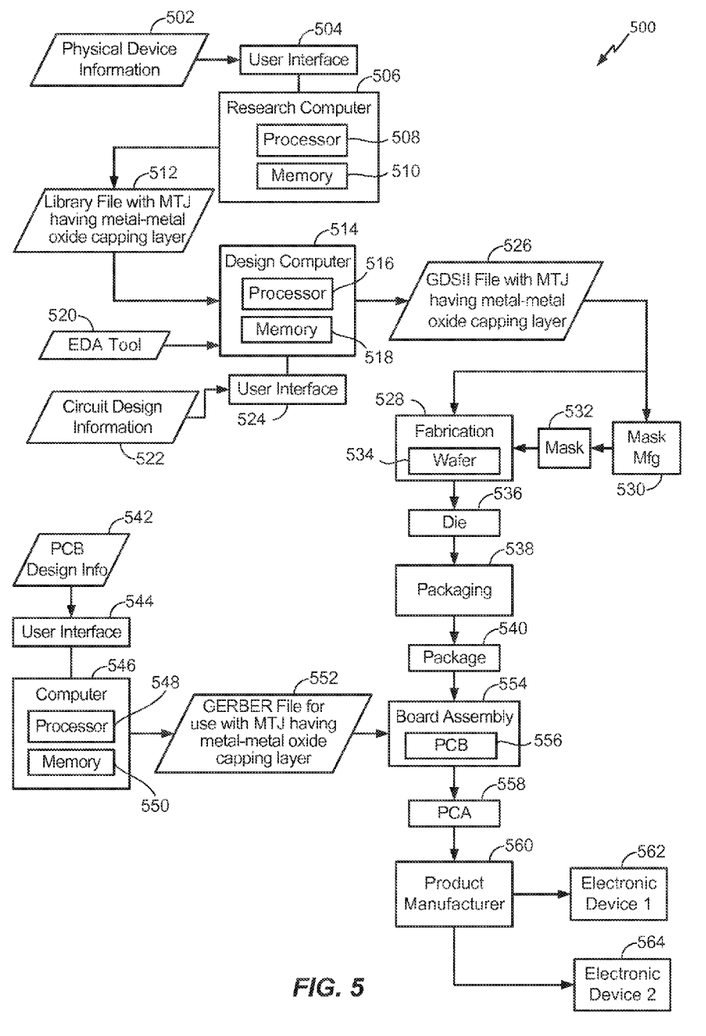
FIG. 5 is a data flow diagram illustrating a manufacturing process for use with magnetic tunneling junction (MTJ) devices.

The foregoing disclosed devices and functionalities (such as the devices of FIG. 1 or FIG. 2, the methods of FIG. 3 or FIG. 4, or any combination thereof) may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then employed in electronic devices. FIG. 5 depicts a particular illustrative embodiment of an electronic device manufacturing process 500.

Physical device information 502 is received in the manufacturing process 500, such as at a research computer 506. The physical device information 502 may include design information representing at least one physical property of a semiconductor device, such as the MTJ device 101 of FIG. 1, the memory array 280 of FIG. 2, the memory cell 282 of FIG. 2, the MTJ structure 201 of FIG. 2, or any combination thereof. For example, the physical device information 502 may include physical parameters, material characteristics, and structure information that is entered via a user interface 504 coupled to the research computer 506. The research computer 506 includes a processor 508, such as one or more processing cores, coupled to a computer readable medium such as a memory 510. The memory 510 may store computer readable instructions that are executable to cause the processor 508 to transform the physical device information 502 to comply with a file format and to generate a library file 512.

In a particular embodiment, the library file 512 includes at least one data file including the transformed design information. For example, the library file 512 may include a library of semiconductor devices including the MTJ device 101 of FIG. 1, the memory array 280 of FIG. 2, the memory cell 282 of FIG. 2, the MTJ structure 201 of FIG. 2, or any combination thereof, that is provided for use with an electronic design automation (EDA) tool 520.

The library file 512 may be used in conjunction with the EDA tool 520 at a design computer 514 including a processor 516, such as one or more processing cores, coupled to a memory 518. The EDA tool 520 may be stored as processor executable instructions at the memory 518 to enable a user of the design computer 514 to design a circuit using the MTJ device 101 of FIG. 1, the memory array 280 of FIG. 2, the memory cell 282 of FIG. 2, the MTJ structure 201 of FIG. 2, or any combination thereof, of the library file 512. For example, a user of the design computer 514 may enter circuit design information 522 via a user interface 524 coupled to the design computer 514. The circuit design information 522 may include design information representing at least one physical property of a semiconductor device, such as the MTJ device 101 of FIG. 1, the memory array 280 of FIG. 2, the memory cell 282 of FIG. 2, the MTJ structure 201 of FIG. 2, or any combination thereof. To illustrate, the circuit design property may include identification of particular circuits and relationships to other elements in a circuit design, positioning information, feature size information interconnection information, or other information representing a physical property of a semiconductor device.

The design computer 514 may be configured to transform the design information, including the circuit design information 522, to comply with a file format. To illustrate, the file formation may include a database binary file format representing planar geometric shapes, text labels, and other information about a circuit layout in a hierarchical format, such as a Graphic Data System (GDSII) file format. The design computer 514 may be configured to generate a data file including the transformed design information, such as a GDSII file 526 that includes information describing the MTJ device 101 of FIG. 1, the memory array 280 of FIG. 2, the memory cell 282 of FIG. 2, the MTJ structure 201 of FIG. 2, or any combination thereof, in addition to other circuits or information. To illustrate, the data file may include information corresponding to a system-on-chip (SOC) that includes the memory array 280 of FIG. 2 and that also includes additional electronic circuits and components within the SOC.

The GDSII file 526 may be received at a fabrication process 528 to manufacture the MTJ device 101 of FIG. 1, the memory array 280 of FIG. 2, the memory cell 282 of FIG. 2, the MTJ structure 201 of FIG. 2, or any combination thereof, according to transformed information in the GDSII file 526. For example, a device manufacture process may include providing the GDSII file 526 to a mask manufacturer 530 to create one or more masks, such as masks to be used for photolithography processing, illustrated as a representative mask 532. The mask 532 may be used during the fabrication process to generate one or more wafers 534, which may be tested and separated into dies, such as a representative die 536. The die 536 includes a circuit including the MTJ device 101 of FIG. 1, the memory array 280 of FIG. 2, the memory cell 282 of FIG. 2, the MTJ structure 201 of FIG. 2, or any combination thereof.

The die 536 may be provided to a packaging process 538 where the die 536 is incorporated into a representative package 540. For example, the package 540 may include the single die 536 or multiple dies, such as a system-in-package (SiP) arrangement. The package 540 may be configured to conform to one or more standards or specifications, such as Joint Electron Device Engineering Council (JEDEC) standards.

Information regarding the package 540 may be distributed to various product designers, such as via a component library stored at a computer 546. The computer 546 may include a processor 548, such as one or more processing cores, coupled to a memory 550. A printed circuit board (PCB) tool may be stored as processor executable instructions at the memory 550 to process PCB design information 542 received from a user of the computer 546 via a user interface 544. The PCB design information 542 may include physical positioning information of a packaged semiconductor device on a circuit board, the packaged semiconductor device corresponding to the package 540 including the MTJ device 101 of FIG. 1, the memory array 280 of FIG. 2, the memory cell 282 of FIG. 2, the MTJ structure 201 of FIG. 2, or any combination thereof.

The computer 546 may be configured to transform the PCB design information 542 to generate a data file, such as a GERBER file 552 with data that includes physical positioning information of a packaged semiconductor device on a circuit board, as well as layout of electrical connections such as traces and vias, where the packaged semiconductor device corresponds to the package 540 including the MTJ device 101 of FIG. 1, the memory array 280 of FIG. 2, the memory cell 282 of FIG. 2, the MTJ structure 201 of FIG. 2, or any combination thereof. In other embodiments, the data file generated by the transformed PCB design information may have a format other than a GERBER format.

The GERBER file 552 may be received at a board assembly process 554 and used to create PCBs, such as a representative PCB 556, manufactured in accordance with the design information stored within the GERBER file 552. For example, the GERBER file 552 may be uploaded to one or more machines for performing various steps of a PCB production process. The PCB 556 may be populated with electronic components including the package 540 to form a representative printed circuit assembly (PCA) 558.

The PCA 558 may be received at a product manufacture process 560 and integrated into one or more electronic devices, such as a first representative electronic device 562 and a second representative electronic device 564. As an illustrative, non-limiting example, the first representative electronic device 562, the second representative electronic device 564, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 562 and 564 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 5 illustrates remote units according to the teachings of the disclosure, the disclosure is not limited to these exemplary illustrated units. Embodiments of the disclosure may be suitably employed in any device which includes active integrated circuitry including memory and on-chip circuitry for test and characterization.

Thus, the MTJ device 101 of FIG. 1, the memory array 280 of FIG. 2, the memory cell 282 of FIG. 2, the MTJ structure 201 of FIG. 2, or any combination thereof, may be fabricated, processed, and incorporated into an electronic device, as described in the illustrative process 500. One or more aspects of the embodiments disclosed with respect to FIGS. 1-4 may be included at various processing stages, such as within the library file 512, the GDSII file 526, and the GERBER file 552, as well as stored at the memory 510 of the research computer 506, the memory 518 of the design computer 514, the memory 550 of the computer 546, the memory of one or more other computers or processors (not shown) used at the various stages, such as at the board assembly process 554, and also incorporated into one or more other physical embodiments such as the mask 532, the die 536, the package 540, the PCA 558, other products such as prototype circuits or devices (not shown), or any combination thereof. For example, the GDSII file 526 or the fabrication process 528 can include a computer readable tangible medium storing instructions executable by a computer, the instructions including instructions that are executable by the computer to initiate deposition of a capping material on a free layer of a magnetic tunneling junction structure to form a capping layer and instructions that are executable by the computer to initiate oxidation of a portion of the capping material to form a layer of oxidized material. The capping material may include magnesium, and oxidizing the capping material to form Magnesium Oxide may reduce a spin pumping effect of the free layer. Although various representative stages of production from a physical device design to a final product are depicted, in other embodiments fewer stages may be used or additional stages may be included. Similarly, the process 500 may be performed by a single entity, or by one or more entities performing various stages of the process 500.

Those of skill would further appreciate that the various illustrative logical blocks, configurations, modules, circuits, and method steps described in connection with the embodiments disclosed herein may be implemented as electronic hardware, computer software executed by a processing unit, or combinations of both. To clearly illustrate this interchangeability of hardware and executing software, various illustrative components, blocks, configurations, modules, circuits, and steps have been described above generally in terms of their functionality. Whether such functionality is implemented as hardware or executable processing instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC my reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A non-transitory computer-readable medium comprising processor executable instructions that, when executed by a processor, cause the processor to:
   initiate deposition of a capping material on a free layer of a magnetic tunneling junction structure to form a capping layer; and
   initiate formation of a first oxidized layer of oxidized material on the capping layer, wherein the first oxidized layer is positioned further from the free layer than a second layer of the capping material.

2. The non-transitory computer-readable medium of claim 1, wherein the capping material includes magnesium.

3. The non-transitory computer-readable medium of claim 1, wherein oxidizing the first layer of the capping material reduces a spin pumping effect of the free layer.

4. The non-transitory computer-readable medium of claim 1, wherein the first oxidized layer is separated from the free layer by the second layer.

5. The non-transitory computer-readable medium of claim 1, wherein the second layer includes a graded layer.

6. The non-transitory computer-readable medium of claim 5, wherein the graded layer comprises a substantially non-magnetic material and an oxide of the substantially non-magnetic material.

7. The non-transitory computer-readable medium of claim 1, wherein a barrier layer is adjacent to a first side of the free layer and the capping layer is adjacent to a second side of the free layer, the second side opposite to the first side.

8. The non-transitory computer-readable medium of claim 1, wherein the capping layer includes a buffer layer, wherein the buffer layer is positioned intermediate to the first layer and the free layer.

9. The non-transitory computer-readable medium of claim 1, wherein the free layer and the capping layer are included in a semiconductor device fabricated according to design information included in a data file, and wherein the capping layer includes the first oxidized layer.

10. The non-transitory computer-readable medium of claim 9, wherein the processor executable instructions further cause the processor to receive the data file.

11. The non-transitory computer-readable medium of claim 9, wherein the data file has a GDSII format.

12. The non-transitory computer-readable medium of claim 9, wherein the semiconductor device is configured to be included in a device selected from a group consisting of a communications device, a computer, a set top box, a music player, a video player, an entertainment unit, a navigation device, a personal digital assistant (PDA), and a fixed location data unit.

13. The non-transitory computer-readable medium of claim 9, wherein the free layer and the capping layer are included in a memory cell of a semiconductor memory array, wherein the semiconductor memory array is configured to be included a packaged semiconductor device, and wherein the packaged semiconductor device is configured to be located on a circuit board according to physical positioning information included in another data file.

14. A method comprising:
   receiving a data file including design information corresponding to a semiconductor device; and
   fabricating the semiconductor device according to the design information, wherein the semiconductor device comprises:
   a barrier layer;
   a free layer; and
   a capping layer, wherein the free layer is adjacent to the barrier layer and the capping layer, and wherein the capping layer includes a first layer of a substantially non-magnetic material and a second layer of an oxide of the substantially non-magnetic material, and wherein the second layer is positioned further from the free layer than the first layer.

15. The method of claim 14, wherein the data file has a GDSII format.

16. A method comprising:
   receiving a data file including design information including physical positioning information of a packaged semiconductor device on a circuit board; and
   manufacturing the circuit board configured to receive the packaged semiconductor device according to the design information, wherein the packaged semiconductor device includes a semiconductor memory array comprising at least one memory cell that comprises:
   a barrier layer;
   a free layer; and
   a capping layer, wherein the free layer is adjacent to the barrier layer and the capping layer, and wherein the capping layer includes a first layer of a substantially non-magnetic material and a second layer of an oxide of the substantially non-magnetic material, and wherein the second layer is positioned further from the free layer than the first layer.

17. The method of claim 16, wherein the data file has a GERBER format.

18. The method of claim 16, further comprising integrating the circuit board into a device selected from a group consisting of a set top box, a music player, a video player, an entertainment unit, a navigation device, a communications device, a personal digital assistant (PDA), a fixed location data unit, and a computer.

\* \* \* \* \*